United States Patent
Zhu et al.

(10) Patent No.: US 11,682,530 B2
(45) Date of Patent: Jun. 20, 2023

(54) MATERIALS FOR STABILIZING SEMICONDUCTORS AND METHODS OF MAKING THE SAME

(71) Applicants: Alliance for Sustainable Energy, LLC, Golden, CO (US); Board of Trustees of Northern Illinois University, DeKalb, IL (US)

(72) Inventors: Kai Zhu, Littleton, CO (US); Fei Zhang, Tianjin (CN); Tao Xu, Naperville, IL (US)

(73) Assignees: Alliance for Sustainable Energy, LLC, Golden, CO (US); Board of Trustees of Northern Illinois University, DeKalb, IL (US)

( * ) Notice: Subject to any disclaimer, the term of this patent is extended or adjusted under 35 U.S.C. 154(b) by 0 days.

(21) Appl. No.: 17/517,830

(22) Filed: Nov. 3, 2021

(65) Prior Publication Data
US 2022/0148818 A1   May 12, 2022

Related U.S. Application Data

(60) Provisional application No. 63/111,017, filed on Nov. 7, 2020.

(51) Int. Cl.
| | |
|---|---|
| H01G 9/20 | (2006.01) |
| H01G 9/00 | (2006.01) |
| H10K 30/30 | (2023.01) |
| H10K 30/40 | (2023.01) |
| H10K 71/12 | (2023.01) |
| H10K 85/40 | (2023.01) |
| H10K 85/30 | (2023.01) |

(52) U.S. Cl.
CPC ......... *H01G 9/2009* (2013.01); *H01G 9/0036* (2013.01); *H10K 30/30* (2023.02); *H10K 30/40* (2023.02); *H10K 71/12* (2023.02); *H10K 85/40* (2023.02); *H10K 85/30* (2023.02)

(58) Field of Classification Search
CPC  H01G 9/2009; H01G 9/0036; H01L 51/0003; H01L 51/0094
See application file for complete search history.

(56) References Cited

FOREIGN PATENT DOCUMENTS

WO    2011107592 A1   9/2011

OTHER PUBLICATIONS

Amaral, L.Q. et al., "Methyl Rotation in Polydimethylsiloxane Studied by Neutron Transmission," Journal of Polymer Science, vol. 14, 1976, 9 pages.
Chen, B. et al., "Imperfections and their passivation in halide perovskite solar cells," Chem. Soc. Rev., vol. 48, 2019, 26 pages.
(Continued)

*Primary Examiner* — Tae-Sik Kang
(74) *Attorney, Agent, or Firm* — Michael A. McIntyre

(57) ABSTRACT

The present disclosure relates to a device that includes a first layer having an active material and a stabilizing material, where the active material includes a semiconductor, the stabilizing material includes at least one of an oligomer, an elastomer, a polymer, and/or a resin, and the stabilizing material provides to the device an improved performance metric compared to a device constructed of the first layer but constructed of only the active material (i.e., in the absence of the stabilizing material).

14 Claims, 13 Drawing Sheets

(56) References Cited

OTHER PUBLICATIONS

Dunfield, S.P. et al., "From Defects to Degradation: A Mechanistic Understanding of Degradation in Perovskite Solar Cell Devices and Modules," Advanced Energy Materials, vol. 10, 2020, 35 pages.

Heo, J.H. et al., "Efficient Organic-Inorganic Hybrid Flexible Perovskite Solar Cells Prepared by Lamination of Polytriarylamine/CH3NH3PbI3/Anodized Ti Metal Substrate and Graphene/PDMS Transparent Electrode Substrate," ACS Applied Materials & Interfaces, vol. 10, 2018, 9 pages.

Kim, J. et al., "Interfacial Modification and Defect Passivation by the Cross-Linking Interlayer for Efficient and Stable CuSCN-Based Perovskite Solar Cells," ACS Applied Materials & Interfaces, vol. 11, 2019, 7 pages.

Kim, J. et al., "Inorganic Encapsulation Method Using Solution-Processible Polysilazane for Flexible Solar Cells," ACS Applied Energy Materials, vol. 3, 2020, 7 pages.

Kim, W. et al., "Enhanced long-term stability of perovskite solar cells by passivating grain boundary with polydimethylsiloxane (PDMS)," Journal of Materials Chemistry A, vol. 7, 2019, 8 pages.

Li, X. et al., "Fully Printable Organic and Perovskite Solar Cells with Transfer-Printed Flexible Electrodes," ACS Applied Materials & Interfaces, vol. 9, 2017, 9 pages.

Liu, Z. et al., "Enhanced photovoltaic performance and stability of carbon counter electrode based perovskite solar cells encapsulated by PDMS," Journal of Materials Chemistry A, vol. 4, 2016, 10 pages.

Miller, D.C. et al., "Durability of polymeric encapsulation materials for concentrating photovoltaic systems," Progress In Photovoltaics: Research and Applications, vol. 21, 2013, 21 pages.

Polysiloxanes (Silicones), Polymer Chemistry, https://polymerdatabase.com/polymerchemistry/Polysiloxanes.html, accessed Jan. 18, 2022, 4 pages.

Svane, K.L. et al., "How Strong Is the Hydrogen Bond in Hybrid Perovskites"?, Journal of Physical Chemistry Letters, vol. 8, 2017, 6 pages.

Weinhold, F. et al., "The Nature of the Silixon-Oxygen Bond," ACS Organometallics, vol. 30, 2011, 10 pages.

Xiang, W. et al., "Improved air stability of perovskite hybrid solar cells via blending poly(dimethylsiloxane)-urea copolymers," Journal of Materials Chemistry A, vol. 5, 2017, 9 pages.

A)

B)

MATERIALS FOR STABILIZING SEMICONDUCTORS AND METHODS OF MAKING THE SAME

CROSS-REFERENCE TO RELATED APPLICATIONS

This application claims priority from U.S. Provisional Patent Application No. 63/111,017 filed on Nov. 7, 2020, the contents of which are incorporated herein by reference in their entirety.

CONTRACTUAL ORIGIN

This invention was made with government support under Contract No. DE-AC36-08GO28308 awarded by the Department of Energy. The government has certain rights in the invention.

BACKGROUND

Perovskite solar cells (PSCs) have high power conversion efficiencies (PCE) and the potential to provide a low levelized cost of electricity of $0.02/kWh by 2030. However, the market adoption of PSCs still faces major challenges, including long term instabilities, toxicity issues related to the use of lead in PSCs, as well as scalability to produce large-area PSCs. Thus, there remains a need for materials and methods that can address these immediate issues.

SUMMARY

An aspect of the present disclosure is a device that includes a first layer having an active material and a stabilizing material, where the active material includes a semiconductor, the stabilizing material includes at least one of an oligomer, an elastomer, a polymer, and/or a resin, and the stabilizing material provides to the device an improved performance metric compared to a device constructed of the first layer but constructed of only the active material (i.e., in the absence of the stabilizing material). In some embodiments of the present disclosure, a substantial portion of the stabilizing material may be present as a dispersed phase and a substantial portion of the active material may be present as a continuous phase. In some embodiments of the present disclosure, a substantial portion of the stabilizing material may be present as a continuous phase and a substantial portion of the active material may be present as a dispersed phase. In some embodiments of the present disclosure, the semiconductor may include at least one of a perovskite, an organic material, and/or an inorganic material.

In some embodiments of the present disclosure, the polymer may include at least one of silicon, carbon, oxygen, and/or hydrogen. In some embodiments of the present disclosure, the polymer may include at least one of a siloxane, a polyethylene, a polyvinylidene difluoride, and/or a polyepoxide. In some embodiments of the present disclosure, the siloxane may further include at least one of an alkyl group, a hydrogen atom, a halogen atom, an aromatic group, a siloxy group, an acrylate, an epoxy group, and/or a carbonate group. In some embodiments of the present disclosure, the alkyl group may include at least one of a methyl group, an ethyl group, a propyl group, and/or a butyl group. In some embodiments of the present disclosure, the aromatic group may include at least one of an aryl group, a phenyl group, and/or a benzyl group. In some embodiments of the present disclosure, the siloxane may include a polydimethylsiloxane.

In some embodiments of the present disclosure, the polymer may be present in the active material at a concentration between about 0.0001 wt % and about 1.0 wt %. In some embodiments of the present disclosure, the device may further include a second layer that includes the stabilizing material, where the second layer is positioned adjacent to the first layer. In some embodiments of the present disclosure, the device may further include a third layer, where the third layer is positioned between the first layer and the second layer and at least a portion of the third layer includes the stabilizing material. In some embodiments of the present disclosure, the device may further include a fourth layer, where the first layer is positioned between the third layer and the fourth layer, and at least a portion of the fourth layer includes the stabilizing material. In some embodiments of the present disclosure, the improved performance metric may include at least one of a thermal stability or a moisture stability.

An aspect of the present disclosure is a method that includes applying a liquid precursor of a stabilizing material to a surface of a device having a solid layer, treating the liquid precursor and the device, resulting in the liquid precursor penetrating at least a portion of the solid layer, and curing the liquid precursor, which converts it to the stabilizing material in a solid form mixed within at least a portion of the solid layer. In some embodiments of the present disclosure, the liquid precursor may have a viscosity between about 0.5 cP and about 10000 cP. In some embodiments of the present disclosure, the liquid precursor may have a surface tension between about 15 mN/m and about 40 mN/rn. In some embodiments of the present disclosure, the liquid precursor may have an average molecular weight between about 154 g/mol and about 100,000 g/mol. In some embodiments of the present disclosure, the stabilizing material may include at least one of an oligomer, an elastomer, a polymer, and/or a resin.

BRIEF DESCRIPTION OF DRAWINGS

Some embodiments are illustrated in referenced figures of the drawings. It is intended that the embodiments and figures disclosed herein are to be considered illustrative rather than limiting.

REFERENCE NUMERALS

Figure 1:
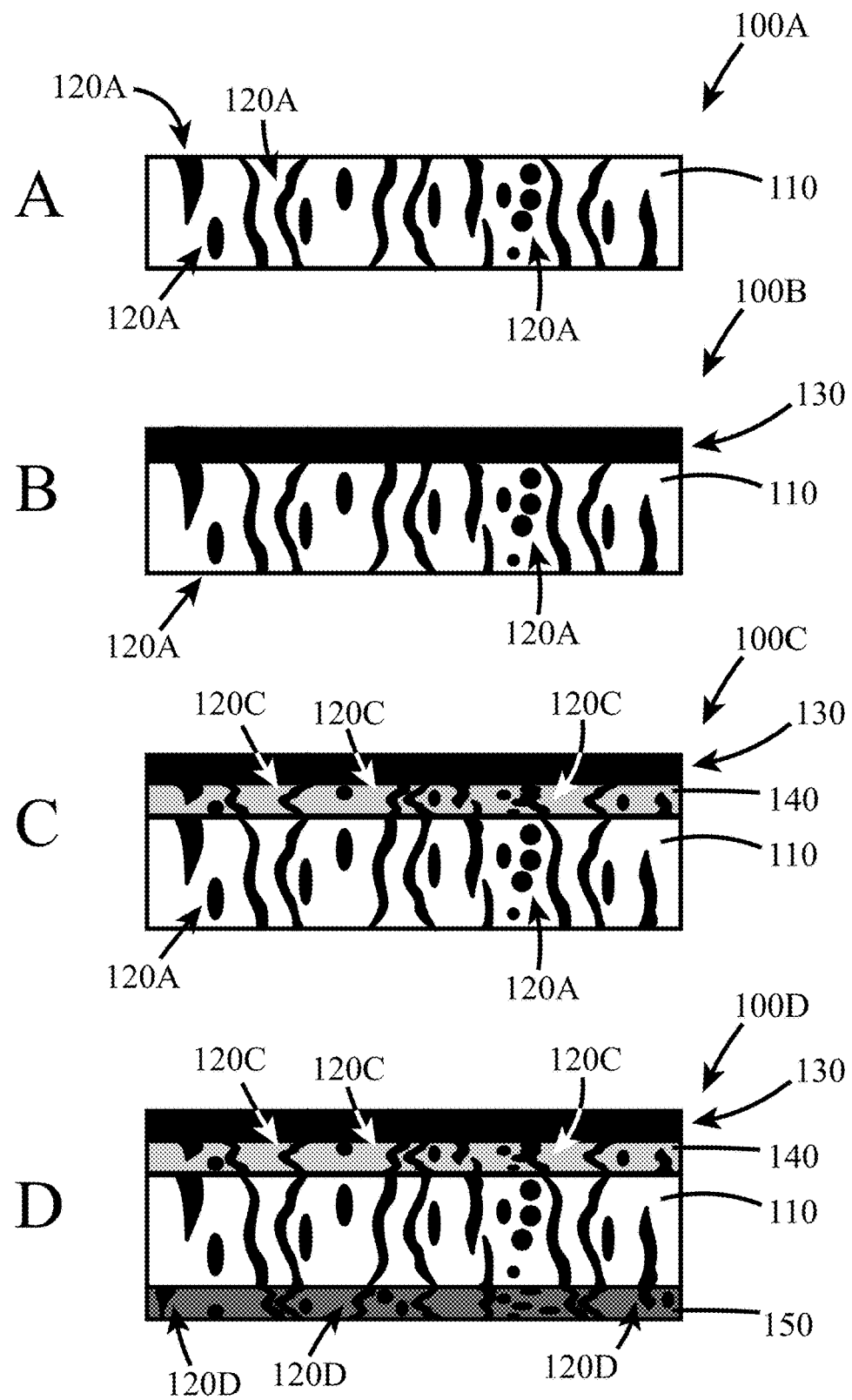
FIG. 1 illustrates a device that includes an active material containing a stabilizing material, according to some embodiments of the present disclosure.

100 . . . device
110 . . . first layer
120 . . . stabilizing material
130 . . . second layer
140 . . . third layer
150 . . . fourth layer

DETAILED DESCRIPTION

The embodiments described herein should not necessarily be construed as limited to addressing any of the particular problems or deficiencies discussed herein. References in the specification to "one embodiment", "an embodiment", "an example embodiment", "some embodiments", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

As used herein the term "substantially" is used to indicate that exact values are not necessarily attainable. By way of example, one of ordinary skill in the art will understand that in some chemical reactions 100% conversion of a reactant is possible, yet unlikely. Most of a reactant may be converted to a product and conversion of the reactant may asymptotically approach 100% conversion. So, although from a practical perspective 100% of the reactant is converted, from a technical perspective, a small and sometimes difficult to define amount remains. For this example of a chemical reactant, that amount may be relatively easily defined by the detection limits of the instrument used to test for it. However, in many cases, this amount may not be easily defined, hence the use of the term "substantially". In some embodiments of the present invention, the term "substantially" is defined as approaching a specific numeric value or target to within 20%, 15%, 10%, 5%, or within 1% of the value or target. In further embodiments of the present invention, the term "substantially" is defined as approaching a specific numeric value or target to within 1%, 0.9%, 0.8%, 0.7%, 0.6%, 0.5%, 0.4%, 0.3%, 0.2%, or 0.1% of the value or target.

As used herein, the term "about" is used to indicate that exact values are not necessarily attainable. Therefore, the term "about" is used to indicate this uncertainty limit. In some embodiments of the present invention, the term "about" is used to indicate an uncertainty limit of less than or equal to ±20%, ±15%, ±10%, ±5%, or ±1% of a specific numeric value or target. In some embodiments of the present invention, the term "about" is used to indicate an uncertainty limit of less than or equal to ±1%, ±0.9%, ±0.8%, ±0.7%, ±0.6%, ±0.5%, ±0.4%, ±0.3%, ±0.2%, or ±0.1% of a specific numeric value or target.

The present disclosure relates to, among other things, compositions and methods directed to the structural instability issues facing semiconducting materials, which is a significant hurdle facing the commercialization of PSCs. When benchmarked to silicon solar cells with a typical lifetime of over 20 years, the limited lifetime of PSCs (typically a few thousand hours) makes it difficult for practical applications to be realized in the near future. Fundamentally, the weak Pb—I bond energy (1.47-eV) and $A^+ \ldots BX_3^-$ cage interaction (0.3~4.4 eV) assures PSCs of superior photovoltaic (PV) performance; but they can be structurally weak when compared to the bond-energy of Si—Si (2.3-eV), which enables the high stability of Si-based PV.

Examples of stress factors that deteriorate the structural stability of perovskite layers and other vulnerable layers (e.g., charge transport layers) include exposure to at least one of moisture, heat, light, voltage potentials, and/or oxidation. At a fundamental level, for the example of perovskite materials, all of these stress factors can lead to structural degradation due essentially to the motion/displacement of atoms/ions in the perovskite structure leading to their transfer to unwanted locations within the device utilizing the perovskite.

To address these issues, an innovative approach is described herein to universally stabilize all layers of a semiconductor-containing device, in particular PSCs of various configurations (conventional, inverted, tandem, etc.) including the electron transport layer (ETL), the perovskite layer (i.e., active layer), the hole transport layer (HTL), and the back electrode (metal electrodes and/or non-metal electrodes). The method that provides this stability to such a device stack, may be performed after the PSCs are completely fabricated (e.g., all of the layers of the device stack have been deposited), to fill the space and voids in defects and/or grain boundaries of any of those layers, or all of the layers, using a strong but inert water/air repellent material. Such a material, for example a suitable polymer, may penetrate into the various layers of a device and/or act as a leveling agent that can later cure to form a seamless solid encapsulation matrix. Among other things, as described herein, such stabilizing materials, also having encapsulating materials and/or leveling properties, are chemically inert and do not dissolve or react with any materials in the semiconductor-containing devices, e.g., PSCs. As shown herein, before curing, such stabilizing materials demonstrate, among other things, the ability to penetrate and migrate into any existing space in the PSCs including grain boundaries, structural defects, and/or voids in any or all of the layers of the device (at least one of the ETL, the perovskite layer, the HTL, and/or the electrode, etc.) of the PSCs. Without wishing to be bound by theory, the end effect after the stabilizing material has cured may be to essentially lock the positions of the atoms/ions in place within the device, while only electrons/holes can move freely to fulfill the required functionality of the device, e.g., photovoltaic device. Further, at least some of the cured stabilizing materials described herein are transparent so that they do not affect the penetration and absorption of light into and by the device, as needed in photovoltaic devices.

In some embodiments of the present disclosure, a material that provides stabilizing and/or encapsulating properties may include at least one of polydimethylsiloxane (PDMS) and/or its derivatives. PDMS belongs to a group of polymeric organosilicon compounds that are commonly referred to as silicones. PDMS is the most widely used silicon-based organic polymer due to its versatility and properties leading to a multitude of applications. It is particularly known for its unusual rheological (or flow) properties due to its ultralow surface tension. Also due to their low surface tension, these polymers are capable of wetting most surfaces.

FIG. 1 illustrates a device 100A, e.g., a perovskite-containing solar cell, that utilizes a stabilizing material 120A, according to some embodiments of the present disclosure. Panel A of FIG. 1 illustrates a device 100A having a first layer 110 into which a stabilizing material 120A has penetrated. Panel A illustrates the stabilizing material 120A as a dispersed phase contained in the continuous material making up the bulk of the first layer 110. However, this is for illustrative purposes only and the stabilizing material 120A may be dispersed within the first layer 110 any number of different ways, depending on the physical properties of the stabilizing material 120A before curing, the physical properties of the first layer 110, the method used to apply the uncured stabilizing material to the first layer 110, and/or the conditions implemented to cure the stabilizing material. In some embodiments of the present disclosure, the cured stabilizing material 120A may be present in the first layer 110 at a concentration between about 0.0001 wt % and about 1.0 wt %. As shown herein, the first layer 110 may be constructed of an active material, e.g., a photovoltaically active material, such as a perovskite, an organic material, and/or an inorganic material. In some embodiments of the present disclosure, a first layer 110, for example a perovskite layer, an organic photovoltaic material, CdTe, and/or CIGS may have a thickness between about 50 nm and about 1000 For the example of a first layer 110 constructed of silicon as the photovoltaic material, the first layer 110 may have a thickness up to about 300 μm.

Referring again to Panel A of FIG. 1, in some embodiments of the present disclosure, the first layer 110 of a device 100A may be constructed of an organic active material. Examples of organic active materials include at least one of phthalocyanines, polyacenes, squareness, perylene dyes, fullerenes, P3HT, MDMO-PPV, $C_{60}BM$, $PC_{70}BM$, PBDB-TF, BTP-4Cl, [Ru(4,4',4"-(COOH)$_3$-terpy)(NCS)$_3$], Di-tetrabutylammonium cis-bis(isothi ocyanato)bis(2,2'-bipyridyl-4,4'-dicarboxylato)ruthenium(II), cis-Bis(isothiocyanato) bis(2,2'-bipyridyl-4,4'-dicarboxylato ruthenium(II), cis-Bis(isothiocyanato)(2,2'-bipyridyl-4,4'-dicarboxylato)(4,4'-di-nonyl-2'-bipyridyl)ruthenium(II), cis-Bis(isothiocyanato)(2,2'-bipyridyl-4,4'-dicarboxylato)(4,4'-bis(5-hexylthiophen-2-yl)-2,2'-bipyridyl)ruthenium(II), Ru(4,4-dicarboxylic acid-2,2'-bipyridine)(4,4'-bis(p-hexyloxystyryl)-2,2-bipyridine)(NCS)$_2$, cis-Bis(isothiocyanato) (2,2'-bipyridyl-4,4'-dicarboxylato)(4,4'-bis(5-(hexylthio) thiophen-2-yl)-2,2'-bipyridyl)ruthenium(II), 3-(2-Benzothiazolyl)-7-(diethylamino)coumarin, 3-(2-N-Methylbenzimidazolyl)-7-N,N-diethylaminocoumarin, 2,3, 6,7-Tetrahydro-9-trifluoromethyl-1H,5H-quinolizino(9,1-gh)coumarin, 2-Cyano-3-[4-[4-(2,2-diphenylethenyl) phenyl]-1,2,3,3a,4,8b-hexahydrocyclopent[b]indol-7-yl]-2-propenoic acid, 5-[[4-[4-(2,2-Diphenylethenyl)phenyl]-1,2, 3-3a,4,8b-hexahydrocyclopent[b]indol-7-yl]methylene]-2-(3-ethyl-4-oxo-2-thioxo thiazolidinylidene)-4-oxo-3-thiazolidineacetic acid, 5-[[4-[4-(2,2-Diphenylethenyl) phenyl]-1,2,3,3a,4,8b-hexahydrocyclopent[b]indol-7-yl] methylene]-2-(3-octyl-4-oxo-2-thioxo thiazolidinylidene)-4-oxo-3-thiazolidineacetic acid, 5-[3-(Carboxymethyl)-5-[[[4-[4-(2,2-diphenylethenyl)phenyl]-1,2,3,3a,4,8b-hexahydrocyclopent[b]indol-7-yl]methylene]-4-oxo-2-thiazolidinylidene]-4-oxo-2-thioxo-3-thiazolidinedodecanoic acid, and/or 1-ethyl-3 methylimidazolium tetrocyanoborate.

In some embodiments of the present disclosure, the first layer 110 of a device 100A may be constructed of an inorganic active material. Examples of inorganic active materials include at least one of silicon, cadmium, tellurium, gallium, arsenic, copper, indium, and/or selenium. In some embodiments of the present disclosure, a stabilizing material 120A may include at least one of an oligomer, an elastomer, a polymer, and/or a resin, where any one of these materials may be constructed of at least one of silicon, carbon, oxygen, hydrogen, and/or a halogen. In some embodiments of the present disclosure, a stabilizing material 120A may include at least one of a siloxane and/or a carbon-based material (e.g., oligomer, polymer, resin, etc.). A stabilizing material 120A may be a siloxane that includes an alkyl group, a hydrogen atom, a halogen atom, and/or an aromatic group. Examples of an alkyl group include a methyl group, an ethyl group, a propyl group, and/or a butyl group. Examples of an aromatic group include at least one of an aryl group, a phenyl group, and/or a benzyl group. A siloxane stabilizing material 120A may include a polydimethylsiloxane (PDMS). In some embodiments of the present disclosure, a siloxane stabilizing material 120A may include at least one of a siloxy group, an acrylate, an epoxy group, a carbonate group, and/or a halogen group. In some embodiments of the present disclosure, a carbon-based stabilizing material 120A may include at least one of polyethylene, polyvinylidene difluoride (PVDF), and/or a polyepoxide. For a photovoltaic device 100A, a stabilizing material 120A may be substantially transparent to light in the visible spectrum, infrared spectrum, and/or near-infrared spectrum of light.

Referring again to FIG. 1, Panel B illustrates a device 120B that includes a second layer 130 positioned adjacent to the first layer 110, where the second layer 130 may be constructed substantially of a stabilizing material 120; e.g., PDMS, as described above for Panel A of FIG. 1. In some embodiments of the present disclosure, the second layer 130 may be a residual layer that remains after the uncured stabilizing material 120 has been deposited on the top surface of the first layer 110, of which at least a portion of the uncured liquid stabilizing material penetrates, e.g., by gravity and/or centrifugation, into at least a portion of the underlying first layer 110; e.g., a perovskite layer. Once the uncured stabilizing material (i.e., stabilizing material precursor) has penetrated into the first layer 110 and has cured (resulting in a substantially solid stabilizing material 120A), the stabilizing material 120 remaining on the surface of the first layer 110 may also cure, resulting in the formation of the second layer 130, e.g., a solid layer of PDMS, with the first layer 110 containing solidified stabilizing material 120A dispersed throughout the first layer 110, as described above. In some embodiments of the present disclosure, such a second layer 130 of the stabilizing material 120 may behave as an encapsulant to the device 100B, further providing protection to the device 100B from the external environment; e.g., moisture, oxygen, etc. In some embodiments of the present disclosure, a second layer 130 of a device 100 may have an average thickness between about 10 nm and about 1 cm, or between about 0.5 mm and about 1 mm.

Panel C of FIG. 1 illustrates a device 100C that includes an additional layer, a third layer 140, positioned between the first layer 110 and the second layer 130, according to some embodiments of the present disclosure. Like the first layer 110, a third layer 140 may include a stabilizing material 120C, which has penetrated into the third layer 140. Panel C illustrates the stabilizing material 120C as a dispersed phase contained in the continuous material making up the bulk of the third layer 140. However, this is for illustrative purposes and the stabilizing material 120C may be dispersed within the third layer 140 any number of different ways, depending on the physical properties of the stabilizing material 120C before curing, the physical properties of the third layer 140, the method used to apply the uncured stabilizing material to the third layer 140, and/or the conditions implemented to cure the stabilizing material. In some embodiments of the present disclosure, the stabilizing material 120 contained within the third layer 140 may result from uncured, liquid stabilizing material originally positioned on the third layer 140, where the uncured stabilizing material penetrates, e.g., by gravity and/or centrifugation, into at least one of the underlying third layer 140 and/or first layer 110 (e.g., active material). Once the uncured liquid stabilizing material (i.e., stabilizing material precursor) has penetrated into these layers, it may cure, resulting in the device 100C having a first layer 110 and a third layer 140 with both of these layers containing solidified stabilizing material, 120A and 120C, respectively. In some embodiments of the present disclosure, a stabilizing material 120C may be present in the third layer 140 at a concentration between about 0.0001 wt % and about 1.0 wt %.

In some embodiments of the present disclosure, a third layer 140 may be constructed of a charge transport material, either an electron transport material (ETM) or a hole transport material (HTM). In some embodiments of the present disclosure, a third layer 140 may be constructed of an ETM such as at least one of $TiO_2$, $SnO_2$, ZnO, $Nb_2O_5$, $BaSnO_3$, C60, PCBM, and/or ICBA. In some embodiments of the present disclosure, a third layer 140 may be constructed of an HTM such as at least one of Spiro-OMeTAD, PTAA, P3HT, PEDOT:PSS, $NiO_x$, CuSCN, $CuGaO_2$, CuPc, spiro-TTB, MeO-2PACz, and/or 2PACz. In some embodiments of the present disclosure, a third layer 140, e.g., constructed of a charge transport material, may have a thickness between about 1 nm and about 10 μm.

Panel D of FIG. 1 illustrates another exemplary device 100D, according to some embodiments of the present disclosure. In this example, another layer, a fourth layer 150 is added to the device 100C shown in Panel C. As shown, a fourth layer 150 may be positioned in the device 100D such that the first layer 110 is positioned between the third layer 140 and the fourth layer 150. Like the first layer 110 and the third layer 140 described above, a fourth layer 150 may include a stabilizing material 120D, which has penetrated into the fourth layer 150. Panel D illustrates the stabilizing material 120D as a dispersed phase contained in the continuous material making up the bulk of the fourth layer 150. However, this is for illustrative purposes and the stabilizing material 120D may be dispersed within the fourth layer 150 any number of different ways, depending on the physical properties of the uncured stabilizing material before curing, the physical properties of the fourth layer 150, the method used to apply the uncured stabilizing material to the third layer 140, and/or the conditions implemented to cure the stabilizing material. In some embodiments of the present disclosure, the stabilizing material 120D contained within the fourth layer 150 may result from uncured, liquid stabilizing material originally positioned on the third layer 140, where the uncured stabilizing material penetrates, e.g., by gravity and/or centrifugation, into at least one of the underlying third layer 140, the first layer 110 (e.g., active material), and/or the fourth layer 150. Once the liquid stabilizing material has penetrated into these layers, it may cure, resulting in the device 100D having a first layer 110, a third layer 140, and a fourth layer 150, all containing solidified stabilizing materials, 120A, 120C, and 120D, respectively. In some embodiments of the present disclosure, a stabilizing material 120D may be present in the fourth layer 150 at a concentration between about 0.0001 wt % and about 1.0 wt %.

In some embodiments of the present disclosure, a fourth layer 150 may be constructed of a charge transport material, either an electron transport material (ETM) or a hole transport material (HTM). In some embodiments of the present disclosure, a fourth layer 150 may be constructed of an ETM such as at least one of $TiO_2$, $SnO_2$, ZnO, $Nb_2O_5$, $BaSnO_3$, C60, PCBM, and/or ICBA. In some embodiments of the present disclosure, a fourth layer 150 may be constructed of an HTM such as at least one of Spiro-OMeTAD, PTAA, P3HT, PEDOT:PSS, $NiO_x$, CuSCN, $CuGaO_2$, CuPc, spiro-TTB, MeO-2PACz, and/or 2PACz. In some embodiments of the present disclosure, a third layer 140 may be constructed of an ETM, while a fourth layer is constructed of an HTM. In some embodiments of the present disclosure, a third layer 140 may be constructed of an HTM, while a fourth layer is constructed of an ETM. In some embodiments of the present disclosure, a fourth layer 150, e.g., constructed of a charge transport material, may have a thickness between about 1 nm and about 10 μm.

Although FIG. 1 illustrates devices having between one and four individual layers, this is for illustrative purposes. Devices having more than four layers fall within the scope of the present disclosure. For example, in some embodiments of the present disclosure, a device may include one or more electrode layers (i.e., current collecting layers), for example electrodes constructed of transparent conducting oxides, other metal oxides, and/or metals. In some embodiments of the present disclosure, any or all additional layers may contain a stabilizing material 120, where the stabilizing material 120 penetrates into the additional layer(s) as an uncured liquid, to subsequently cure into the stabilizing material 120 in a solid form.

Figure 2A:
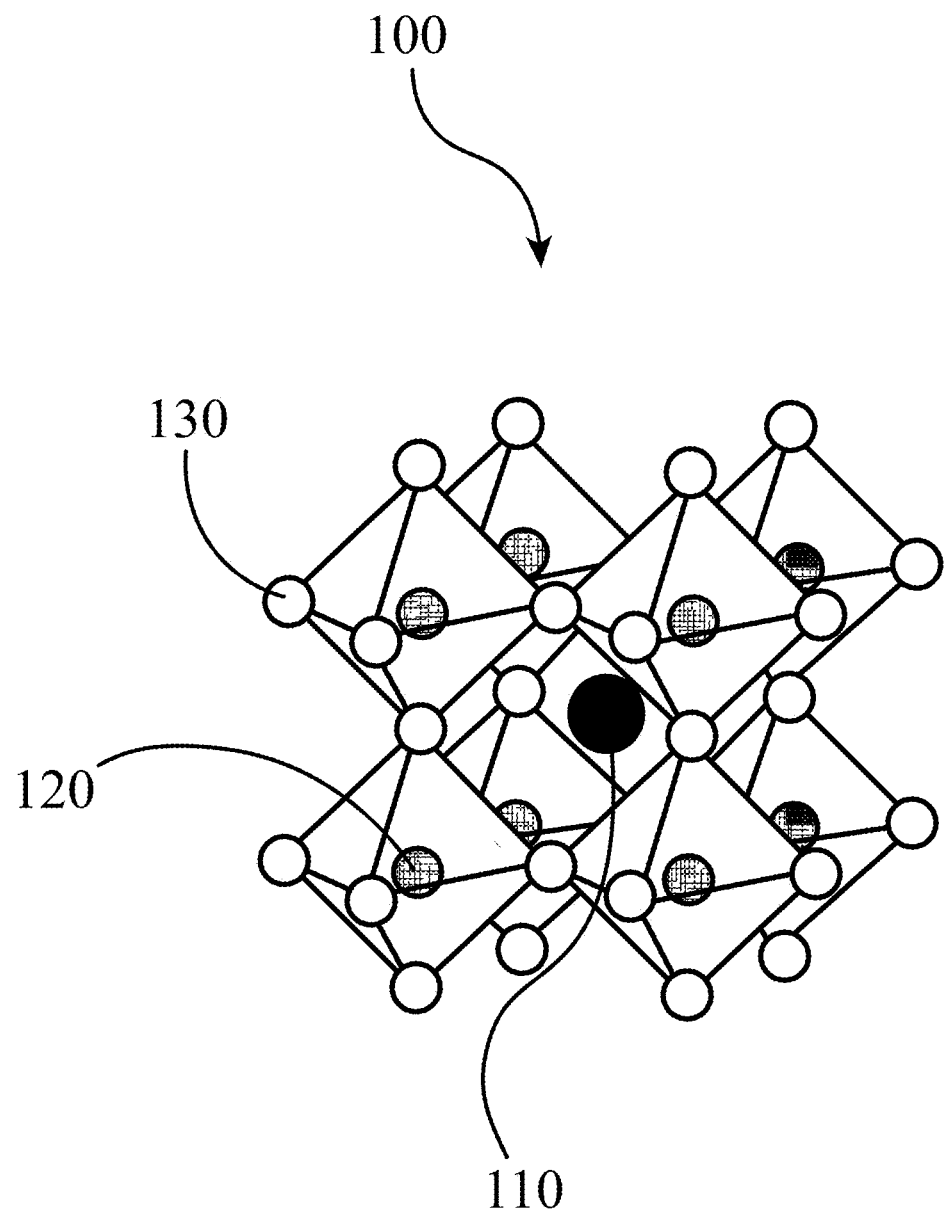
FIGS. 2A, 2B, and 2C illustrate perovskites, according to some embodiments of the present disclosure.
Figure 2B:
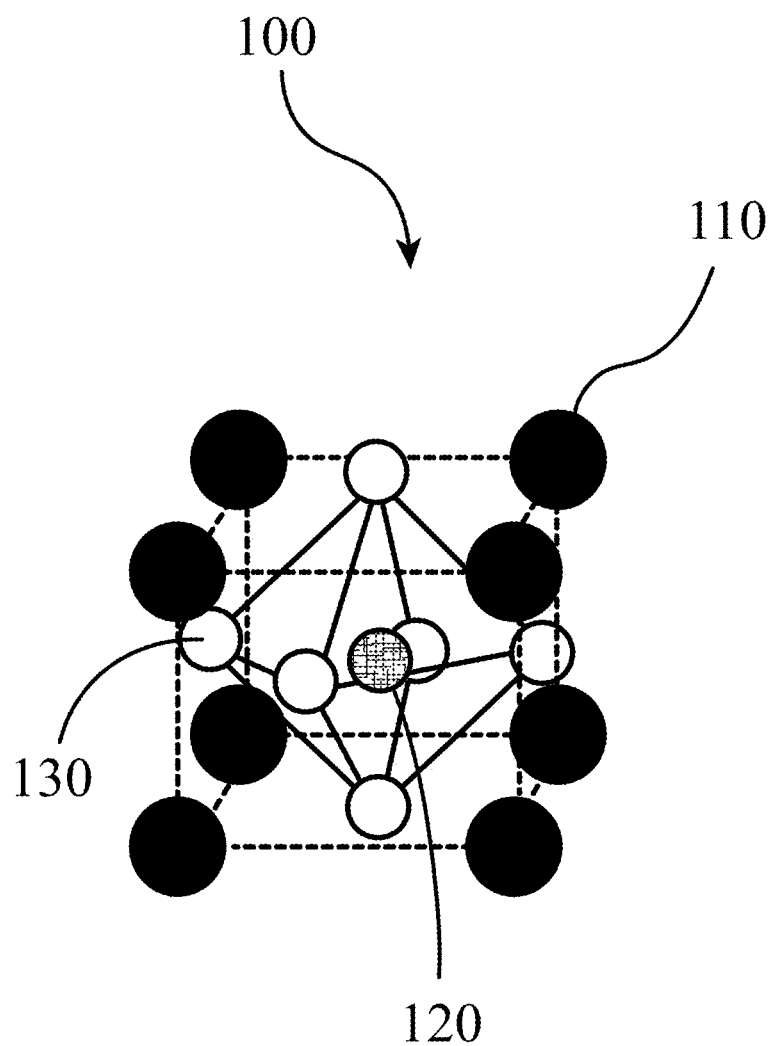
Figure 2C:
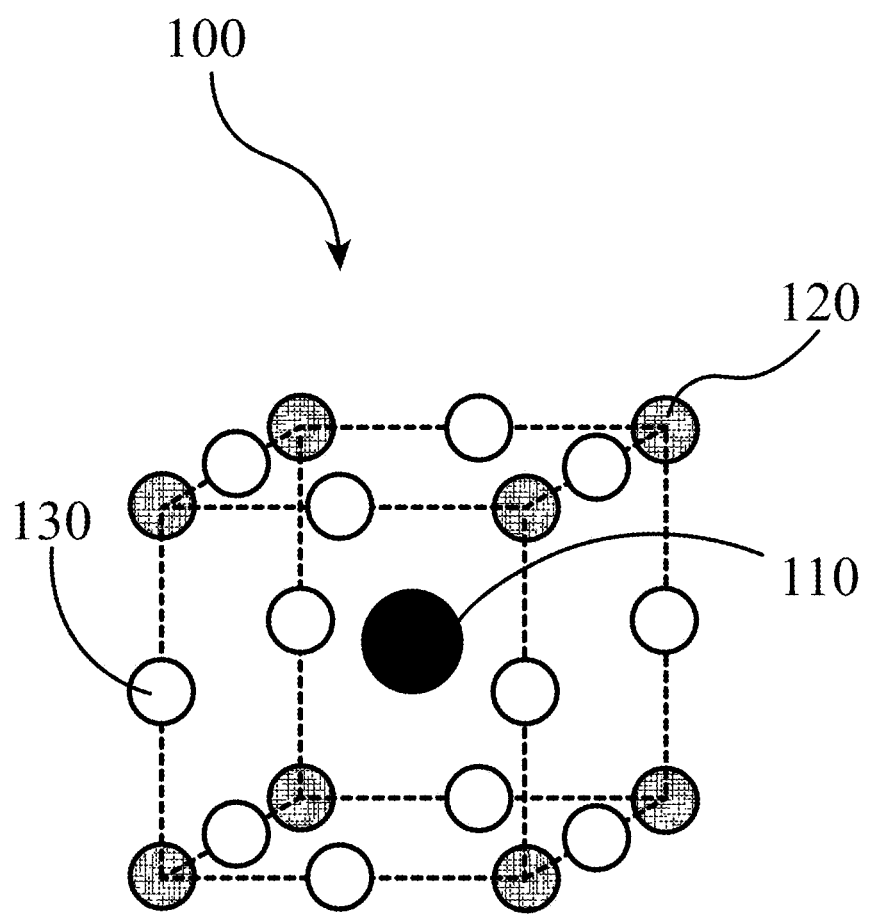

FIGS. 2A, 2B, and 2C illustrate that perovskites 100, for example halide perovskites, may organize into cubic crystalline structures with corner-sharing octahedra, as well as other crystalline structures such as tetragonal, hexagonal, and orthorhombic with either edge- or face-sharing octahedra, and may be described by the general formula $ABX_3$, where X (130) is an anion and A (110) and B (120) are cations, typically of different sizes. In some embodiments of the present disclosure, a perovskite may have a layered structure that includes 3D structures described above positioned between sheets of organic cations; these are often termed 2D perovskites. Mixture of the 2D and 3D phases are also possible. FIG. 2A illustrates that a perovskite 100 may be organized into eight octahedra surrounding a central A-cation 110, where each octahedra is formed by six X-anions 130 surrounding a central B-cation 120. FIG. 2B illustrates that a perovskite 100 may be visualized as a cubic unit cell, where the B-cation 120 is positioned at the center of the cube, an A-cation 110 is positioned at each corner of the cube, and an X-anion 130 is face-centered on each face of the cube. FIG. 2C illustrates that a perovskite 100 may also be visualized as a cubic unit cell, where the B-cation 120 resides at the eight corners of a cube, while the A-cation 110 is located at the center of the cube and with 12 X-anions 130 centrally located between B-cations 120 along each edge of the unit cell. For both unit cells illustrated in FIGS. 2B and 2C, the A-cations 110, the B-cations 120, and the X-anions 130 balance to the general formula $ABX_3$, after accounting for the fractions of each atom shared with neighboring unit cells. For example, referring to FIG. 2B, the single B-cation 120 atom is not shared with any of the neighboring unit cells. However, each of the six X-anions 130 is shared between two unit cells, and each of the eight A-cations 110 is shared between eight unit cells. So, for the unit cell shown in FIG. 2B, the stoichiometry simplifies to B=1, A=8*0.125=1, and X=6*0.5=3, or $ABX_3$. Similarly, referring again to FIG. 2C, since the A-cation is centrally positioned, it is not shared with any of the unit cells neighbors. However, each of the 12 X-anions 130 is shared between four neighboring unit cells, and each of the eight B-cations 120 is shared between eight neighboring unit cells, resulting in A=1, B=8*0.125=1, and X=12*0.25=3, or $ABX_3$. Referring again to FIG. 2C, the X-anions 130 and the B-cations 120 are shown as aligned along an axis; e.g., where the angle at the X-anion 130 between two neighboring B-cations 120 is exactly 180 degrees, referred to herein as the tilt angle. However, a perovskite 100 may have a tilt angle not equal to 180 degrees. For example, some embodiments of the present disclosure may have a tilt angle between 153 and 180 degrees.

Typical inorganic perovskites include calcium titanium oxide (calcium titanate) minerals such as, for example, $CaTiO_3$ and $SrTiO_3$. In some embodiments of the present invention, the A-cation 110 may include a nitrogen-containing organic compound such as an alkyl ammonium compound. The B-cation 120 may include a metal and the X-anion 130 may include a halogen. Additional examples for the A-cation 110 include organic cations and/or inorganic cations, for example Cs, Rb, K, Na, Li, and/or Fr. Organic A-cations 110 may be an alkyl ammonium cation, for example a $C_{1-20}$ alkyl ammonium cation, a $C_{1-6}$ alkyl ammonium cation, a $C_{2-6}$ alkyl ammonium cation, a $C_{1-5}$ alkyl ammonium cation, a $C_{1-4}$ alkyl ammonium cation, a $C_{1-3}$ alkyl ammonium cation, a $C_{1-2}$ alkyl ammonium cation, and/or a $C_1$ alkyl ammonium cation. Further examples of organic A-cations 110 include methylammonium ($CH_3NH_3^+$), ethylammonium ($CH_3CH_2NH_3^+$), propylammonium ($CH_3CH_2CH_2NH_3^+$), butylammonium ($CH_3CH_2CH_2CH_2NH_3^+$), formamidinium ($NH_2CH=NH_2^+$), hydrazinium, acetylammonium, dimethylammonium, imidazolium, guanidinium, benzylammonium, phenethylammonium, butylammonium and/or any other suitable nitrogen-containing or organic compound. In other examples, an A-cation 110 may include an alkylamine. Thus, an A-cation 110 may include an organic component with one or more amine groups. For example, an A-cation 110 may be an alkyl diamine halide such as formamidinium ($CH(NH_2)_2$). Thus, the A-cation 110 may include an organic constituent in combination with a nitrogen constituent. In some cases, the organic constituent may be an alkyl group such as straight-chain or branched saturated hydrocarbon group having from 1 to 20 carbon atoms. In some embodiments, an alkyl group may have from 1 to 6 carbon atoms. Examples of alkyl groups include methyl ($C_1$), ethyl ($C_2$), n-propyl ($C_3$), isopropyl ($C_3$), n-butyl ($C_4$), tert-butyl ($C_4$), sec-butyl ($C_4$), iso-butyl ($C_4$), n-pentyl ($C_5$), 3-pentanyl ($C_5$), amyl ($C_5$), neopentyl ($C_5$), 3-methyl-2-butanyl ($C_5$), tertiary amyl ($C_5$), and n-hexyl ($C_6$). Additional examples of alkyl groups include n-heptyl ($C_7$), n-octyl ($C_8$) and the like.

Examples of metal B-cations 120 include, for example, lead, tin, germanium, and or any other 2+ valence state metal that can charge-balance the perovskite 100. Further examples include transition metals in the 2+ state such as Mn, Mg, Zn, Cd, and/or lanthanides such as Eu. B-cations may also include elements in the 3+ valence state, as described below, including for example, Bi, La, and/or Y. Examples for X-anions 130 include halogens: e.g., fluorine, chlorine, bromine, iodine and/or astatine. In some cases, the perovskite halide may include more than one X-anion 130, for example pairs of halogens; chlorine and iodine, bromine and iodine, and/or any other suitable pairing of halogens. In other cases, the perovskite 100 may include two or more halogens of fluorine, chlorine, bromine, iodine, and/or astatine.

Thus, the A-cation 110, the B-cation 120, and X-anion 130 may be selected within the general formula of $ABX_3$ to produce a wide variety of perovskites 100, including, for example, methylammonium lead triiodide ($CH_3NH_3PbI_3$), and mixed halide perovskites such as $CH_3NH_3PbI_{3-x}Cl_x$, and $CH_3NH_3PbI_{3-x}Br_x$. Thus, a perovskite 100 may have more than one halogen element, where the various halogen elements are present in non-integer quantities; e.g., x is not equal to 1, 2, or 3. In addition, perovskite halides, like other organic-inorganic perovskites, can form three-dimensional (3-D), two-dimensional (2-D), one-dimensional (1-D) or zero-dimensional (0-D) networks, possessing the same unit structure. As described herein, the A-cation 110 of a perovskite 100, may include one or more A-cations, for example, one or more of cesium, FA, MA, etc. Similarly, the B-cation 120 of a perovskite 100, may include one or more B-cations, for example, one or more of lead, tin, germanium, etc. Similarly, the X-anion 130 of a perovskite 100 may include one or more anions, for example, one or more halogens (e.g., at least one of I, Br, Cl, and/or F), thiocyanate, and/or sulfur. Any combination is possible provided that the charges balance.

For example, a perovskite having the basic crystal structure illustrated in FIGS. 2A-2C, in at least one of a cubic, orthorhombic, and/or tetragonal structure, may have other compositions resulting from the combination of the cations having various valence states in addition to the 2+ state and/or 1+ state described above for lead and alkyl ammonium cations; e.g., compositions other than $AB^{2+}X_3$ (where A is one or more cations, or for a mixed perovskite where A is two or more cations). Thus, the methods described herein may be utilized to create novel mixed cation materials having the composition of a double perovskite (elpasolites), $A_2B^{1+}B^{3+}X_6$, with an example of such a composition being $Cs_2BiAgCl_6$ and $Cs_2CuBiI_6$. Another example of a composition covered within the scope of the present disclosure is described by $A_2B^{4+}X_6$, for example $Cs_2PbI_6$ and $Cs_2SnI_6$. Yet another example is described by $A_3B_2^{3+}X_9$, for example $Cs_3Sb_2I_9$. For each of these examples, A is one or more cations, or for a mixed perovskite, A is two or more cations.

Figure 3:
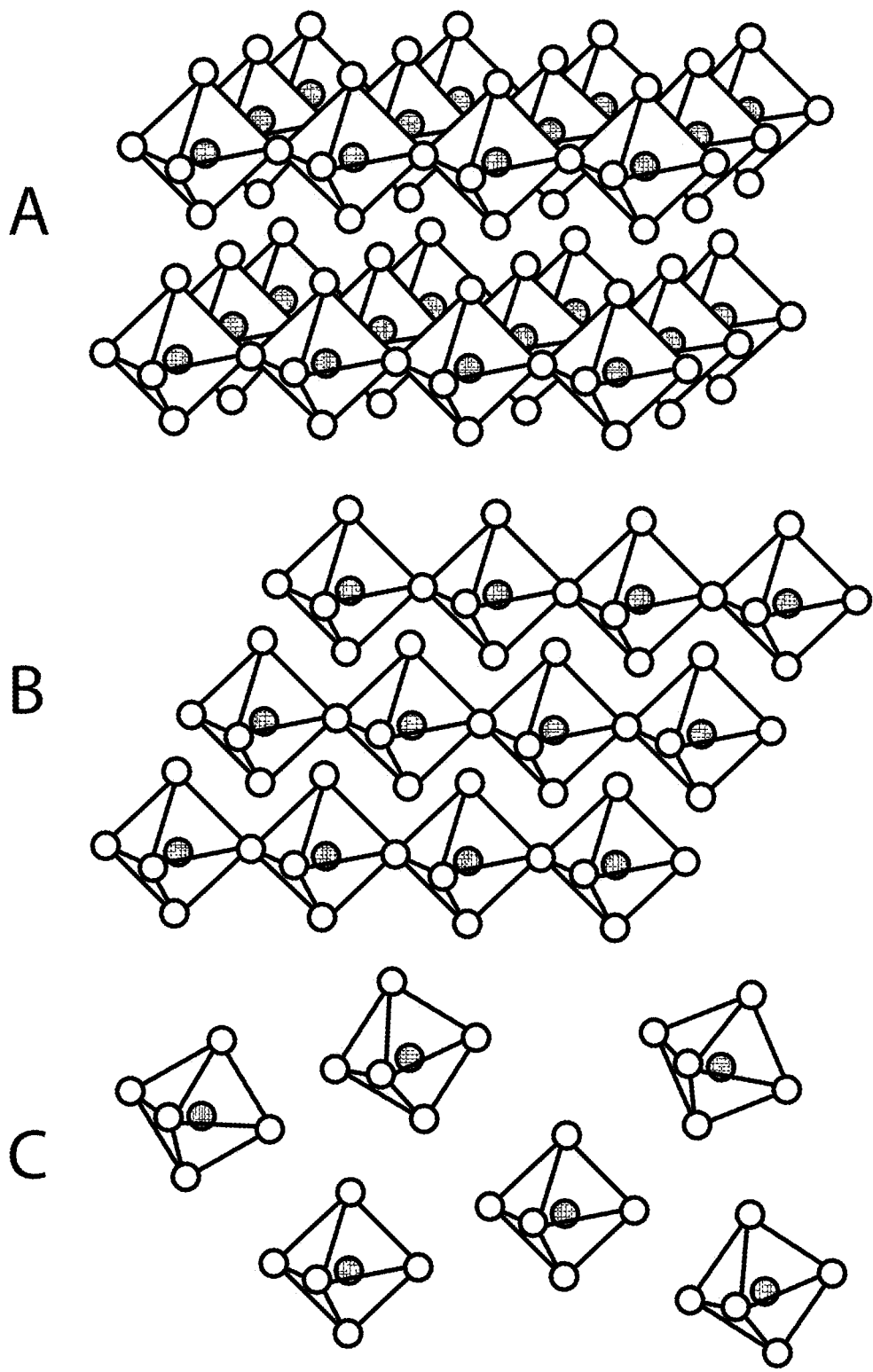
FIG. 3 illustrates 2D, 1D, and 0D perovskite structures, in Panels A, B, and C, respectively, according to some embodiments of the present disclosure.

In addition, perovskite halides, like other organic-inorganic perovskites, can form a three-dimensional (3D) network, a two-dimensional (2D) network, a one-dimensional (1D) network and/or a zero-dimensional (0D) network, possessing the same unit structure. A perovskite's 3D network is illustrated in FIGS. 2A, 2B, and 2C. FIG. 3 illustrates a 2D perovskite network, a 1D perovskite network, and a 0D perovskite network, in Panels A, B, and C, respectively. As described above, a 3D perovskite may adopt a general chemical formula of $ABX_3$, in which the A-cation may be a monovalent cation (e.g., methylammonium and/or formamidinium $CH(NH_2)_2^+$, the B-cation may be a divalent cation (e.g., $Pb^{2+}$ and/or $Sn^{2+}$), and the X-anion may be a halide anion ($I^-$, $Br^-$, and/or $Cl^-$). In this formula, the 3D network of perovskites may be constructed by linking all corner sharing $BX_6$ octahedra, with the A-cation filling the space between eight octahedral unit cells to balance the crystal charge.

Referring to Panel A of FIG. 3, through the chemically accomplished dimensional reduction of the 3D crystal lattice, 2D perovskites, $(A')_m(A)_{n-1}B_nX_{3n+1}$, may adopt a new structural and compositional dimension, A' (not shown), where monovalent (m=2) or divalent (m=1) cations can intercalate between the X-anions of the 2D perovskite sheets. Referring to Panel B of FIG. 3, 1D perovskites are constructed by $BX_6$ octahedral chained segments spatially isolated from each other by surrounding bulky organic cations (not shown), leading to bulk assemblies of paralleled octahedral chains. Referring to Panel C of FIG. 3, typically, the 0D perovskites are constructed of isolated inorganic octahedral clusters and surrounded by small cations (not shown) which are connected via hydrogen bonding.

As described above, in some embodiments of the present disclosure, a stabilizing material may include PDMS, which has the general structure of $—[Si(R_2)—O]_n—$ where the value of n determines the degree of polymerization. Structure 1 illustrates the structure of PDMS when R is equal to a methyl group and the polymer chains are end-capped with hydroxyl groups (other end-capping groups may include methyl groups):

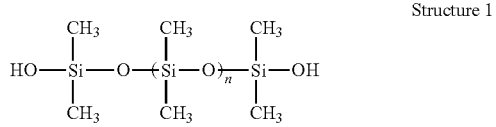

Structure 1

In general, PDMS possesses the following properties:
1. Si—C bond energy is low (75 kcal/mol) and long (1.88 A), Si—O bond;
2. flatter Si—O—Si bond angle (130-150° C.) versus C—O—C(105-115° C.);
3. Lower energy of rotation that results from Si—O longer bond length and flatter bond angles than C—O bond;
4. Lower silicon electronegativity (1.8) than carbon (2.5), which leads to a very polarized Si—O back bond that is highly ionic; and
5. Low intramolecular and intermolecular (van der Waals) forces.

Figure 11:
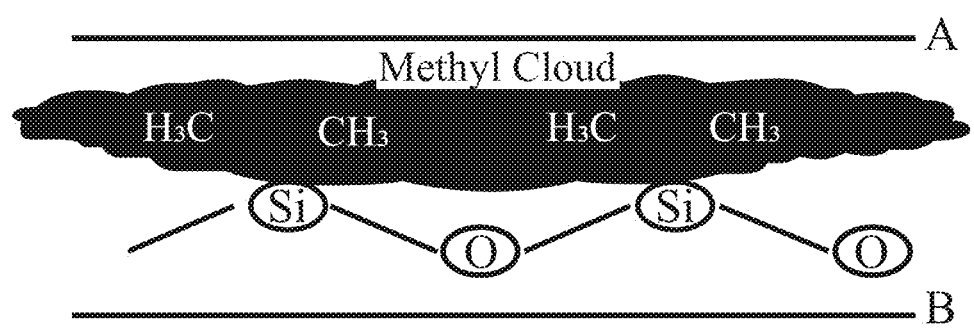
FIG. 11 illustrates an Si—O—Si backbone, according to some embodiments of the present disclosure.

The freedom of rotation of a Si—O—Si backbone allows for organo-cloud orientation that facilitates an effective spatial orientation/alignment that the interface of the surface to which an organo-siloxane polymer is exposed (lines A and B illustrated in FIG. 11).

This freedom of rotation allows for maximizing surface activity, aligning the inorganic backbone (high surface energy Si—O—Si backbone) to high-polarity surfaces (line B) and organo-groups (low surface energy $CH_3$ groups) to low polarity surface (line A). Such a structure makes PDMS a perfect material for combining with perovskite materials. Unlike most other polymers, PDMS possesses an inorganic backbone of —(Si—O)— repeat units. The Si—O bonds are strongly polarized and without side groups, should lead to strong intermolecular interactions. However, the nonpolar methyl groups shield the polar backbone. For this reason, PDMS has a very low critical surface tension despite a very polar backbone. In fact, PDMS has one of the lowest critical surface tensions of all polymers which is comparable to that of Teflon.

Due to the low rotation barriers (nearly vanishing rotation energy barrier) of Si—O—Si bond, most siloxanes are very flexible. For example, the rotation energy around a $CH_2—CH_2$ bond in polyethylene is about 12.1 kJ/mol but only 3.8 kJ/mol around a $Me_2Si—O$ bond in PDMS, corresponding to a nearly free rotation. Furthermore, chain-to-chain interaction is rather weak due to the low cohesive energy, and the distance between adjacent chains is noticeably larger in silicones than in alkanes, which also contributes to the greater flexibility of PDMS. Due to great flexibility of the chain backbone, the activation energy of viscous flow is rather low and the viscosity is less dependent on temperature compared to hydrocarbon polymers, making will suited for penetrating into solid materials and for acting as a leveling agent.

PDMS has a low surface tension in the range of 20 to 25 mN/m and consequently can wet most surfaces. With the methyl groups located on the outside, silicones produce very hydrophobic films. Due to the large free volume, most gases have a high solubility and high diffusion coefficient in silicones. That is, silicones have a high permeability to oxygen, nitrogen and water vapor, even if in this case liquid water is not capable of wetting the silicone surface. In other words, air trapped in PSCs devices can be repelled by the penetrating PDMS. PDMS also has outstanding temperature and oxidative stability, excellent low temperature flexibility, and high resistance to weathering and many chemicals. PDMS is optically clear and, in general, inert, non-toxic, and non-flammable and high compressibility. Further, it is worth noting for PDMS that the methyl groups along the chain can be substituted by many other groups such as ethyl, phenyl, vinyl, —F, —Cl, —Br, which allows for tailoring the chemical, mechanical and thermophysical properties for a wide variety of applications.

Many other groups like phenyl, vinyl, alkyl, or trifluoropropyl can substitute the methyl groups along the chain. The simultaneous presence of other organic groups attached to the inorganic backbone leads to many unique properties and allows their use in a broad range of fields. One general drawback of the presence of other organic groups along the chain backbone is the reduction of the polymer's thermal stability. But with these substitutions, many other properties can be (greatly) improved. For example, a small percentage of phenyl groups along the chain reduces the tendency to crystallization and allows the polymer to remain flexible even at very low temperatures. The phenyl groups also increase the refractive index. Trifluoropropyl groups along the chain change the solubility parameter of the polymer from 15.3 MPa1/2 to 19.4 MPa1/2, which reduces the swelling of silicone elastomers in alkane and aromatic solvents. Silicone copolymers can also be prepared with excellent surfactant properties, with the silicone as the hydrophobic part. For at least these reasons, PDMS and/or PDMS-containing polymers, resins, and/or elastomers may be utilized as stabilizing materials in a variety of semiconductor-containing devices, for example perovskite-containing devices such as photovoltaic devices, light-emitting diodes, and/or displays.

Thus, PDMS is very well suited for use as a stabilizing agent in various electronic devices, including PSCs. However, PDMS is only one example of a material that can fulfill this role. Other materials, e.g., oligomers, polymers, resins, etc., having similar physical properties as described above for PDMS, also fall within the scope of the present disclosure. Examples can include polyethylene, polyvinylidene difluoride (PVDF), or a polyepoxide.

EXAMPLES

PDMS (Sylgard 184 from Corning) and curing agent trimethylsiloxyterminated poly(methylhydro-siloxane) were mixed in a ratio from 10V:0V to 10V:5V range as needed. The mixture was applied to the entire surface area of a PSC device to cover the active area. The PDMS and curing agent mixture remained at room temperature without further heating to provide sufficient time for the uncured PDMS penetrate into all the layers of the entire devices and to fill as many voids as possible via either the edges of the devices or the voids in the back contact electrodes (e.g., gold electrodes). It is important to maintain the PDMS (or any other suitable stabilizing material precursor) in liquid form for a time sufficient (e.g., between 1 minute to 5 days or above) to allow full penetration of the PDMS into the device stack's various layers.

Figure 4:
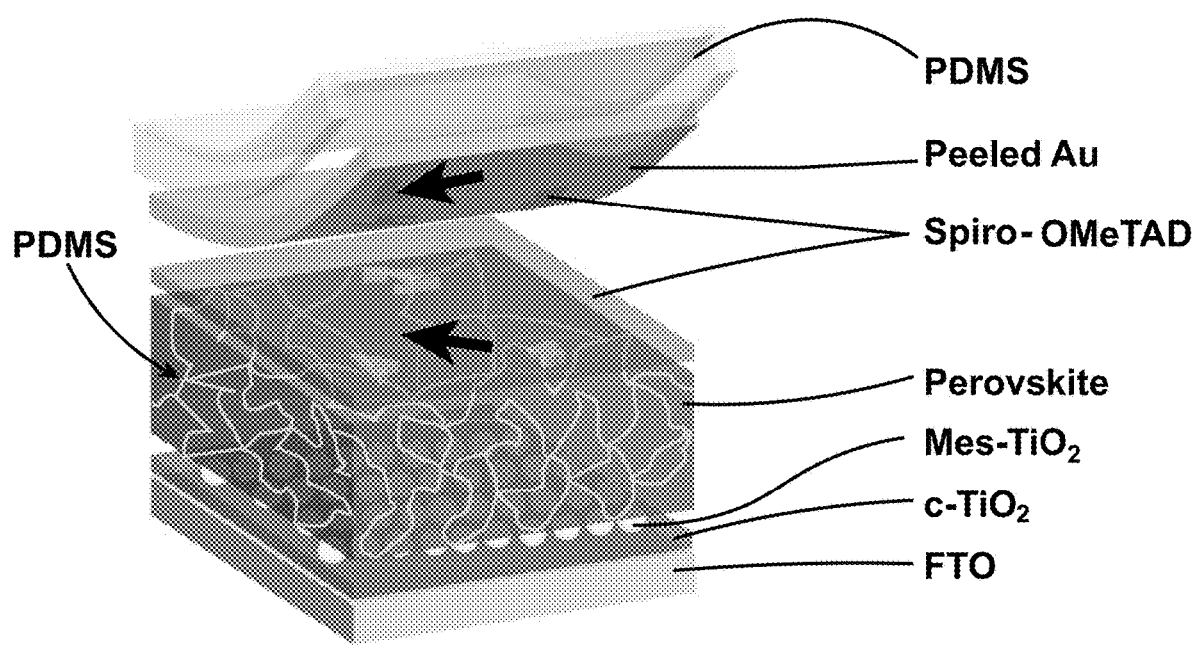
FIG. 4 illustrates a schematic of a device treated with a stabilizing material, according to some embodiments of the present disclosure. Arrows indicate areas where EDX measurements were made (see FIGS. 5 and 6).
Figure 5:
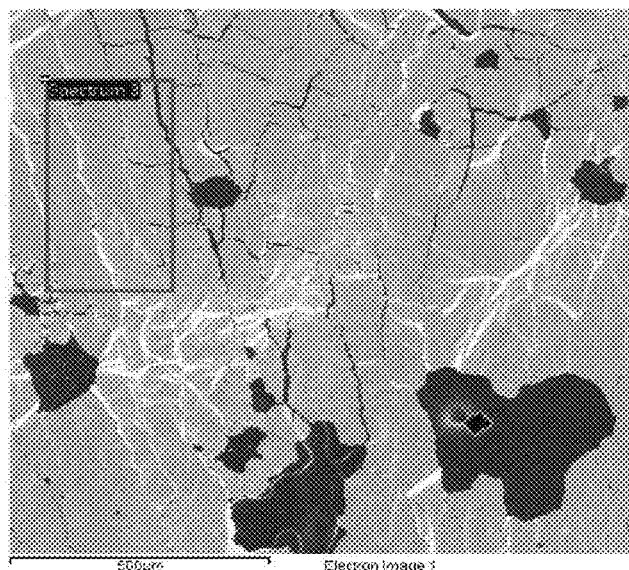
FIG. 5 illustrates an optical microscopy image (Panel A) and an EDX elemental results (Panel B) of the backside (the side adjacent to the hole transport layer) of a removed gold electrode proving the penetration of PDMS into the device by the presence of silicon, according to some embodiments of the present disclosure. No silicon signal was observed in samples not receiving the PDMS treatments described herein.
Figure 5:
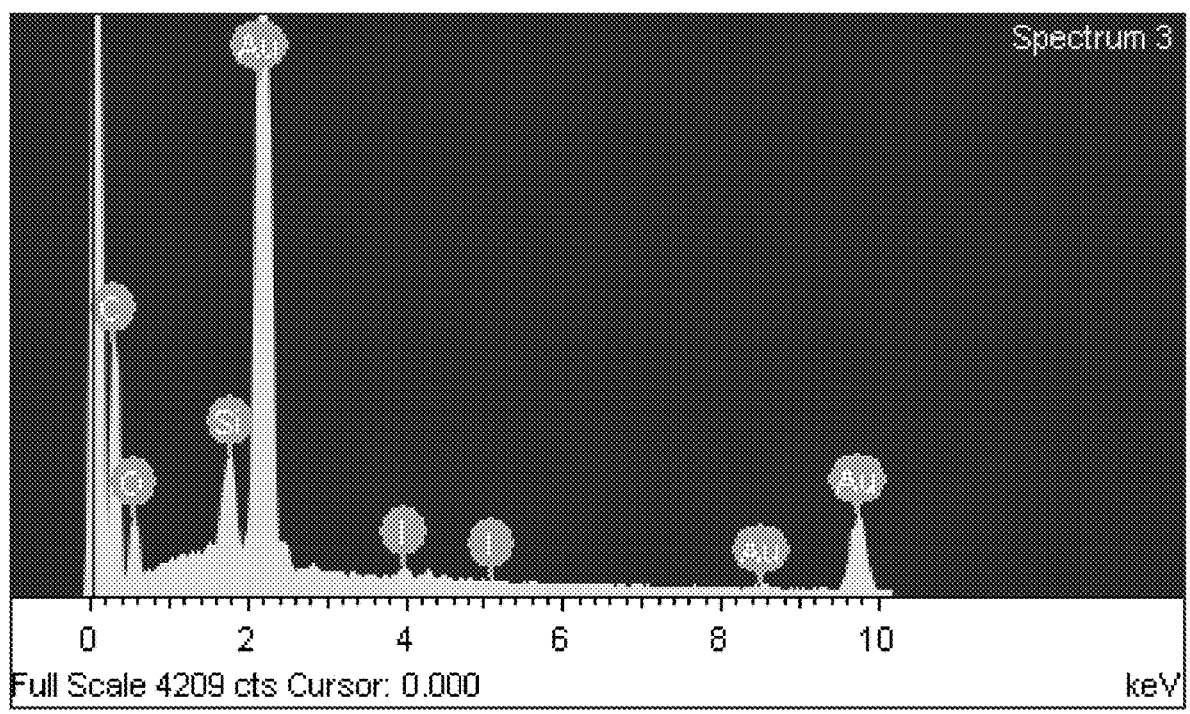
Figure 6:
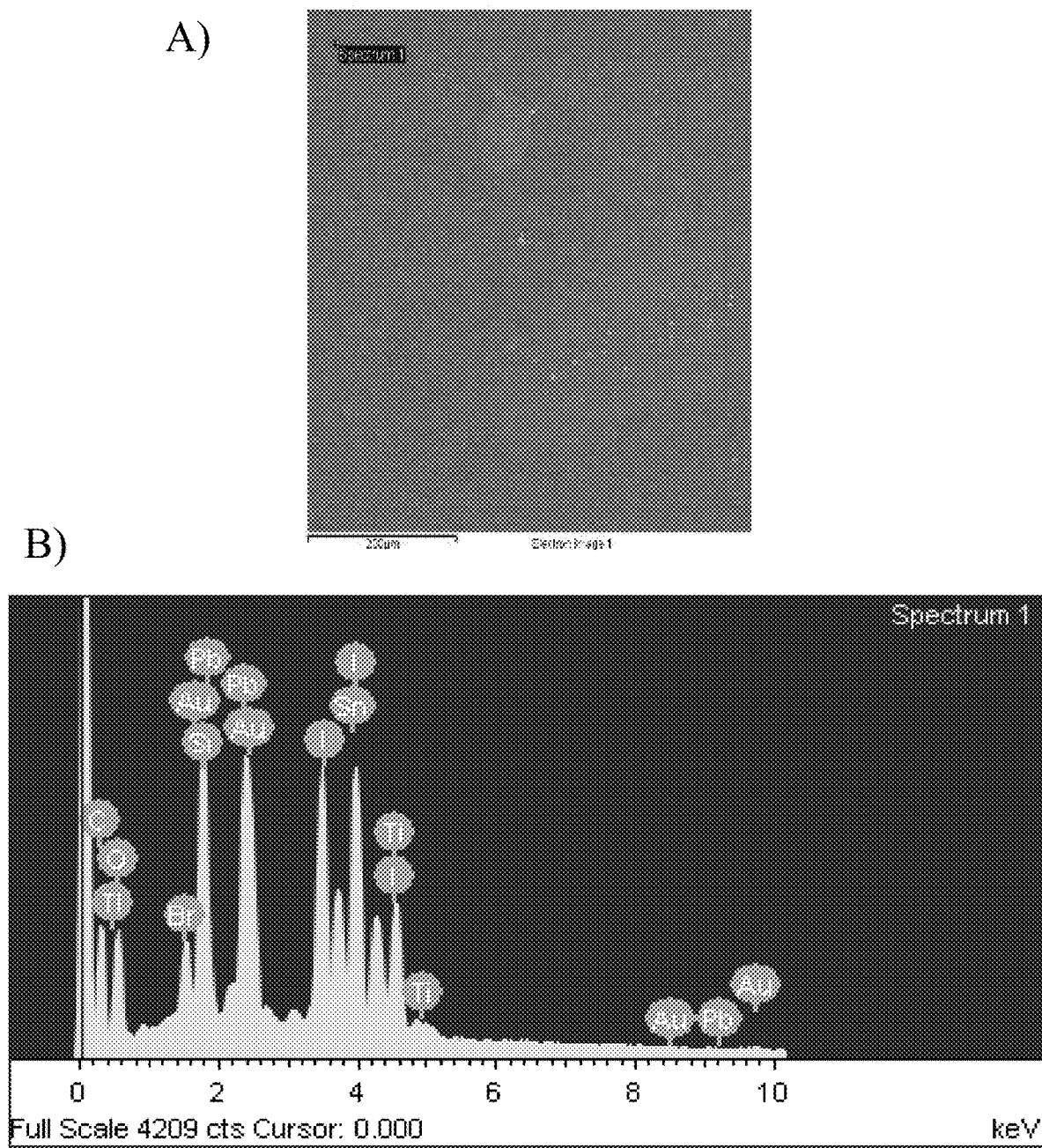
FIG. 6 illustrates an optical microscopy image (Panel A) and an EDX elemental results (Panel B) of the layers underneath a gold electrode that has been removed from the device, demonstrating penetration of PDMS into the device by the presence of silicon, according to some embodiments of the present disclosure. No silicon signal was observed in samples not receiving the PDMS treatments described herein.

FIG. 4 illustrates a schematic of a device treated with a stabilizing material, according to some embodiments of the present disclosure. Indications of where EDX measurements (see FIGS. 5 and 6) were made are indicated by the bold arrows. FIG. 5 illustrates the EDX elemental study corresponding to the backside (the side adjacent to hole transport layer) of the peeled gold electrode proving the presence of PDMS by the presence of silicon, according to some embodiments of the present disclosure. FIG. 6 illustrates the EDX elemental study corresponding to the layers underneath a gold electrode that has been removed from the device, demonstrating the presence of PDMS by the presence of silicon, according to some embodiments of the present disclosure. No silicon signal was observed in samples not receiving the PDMS treatments described herein.

Figure 7:
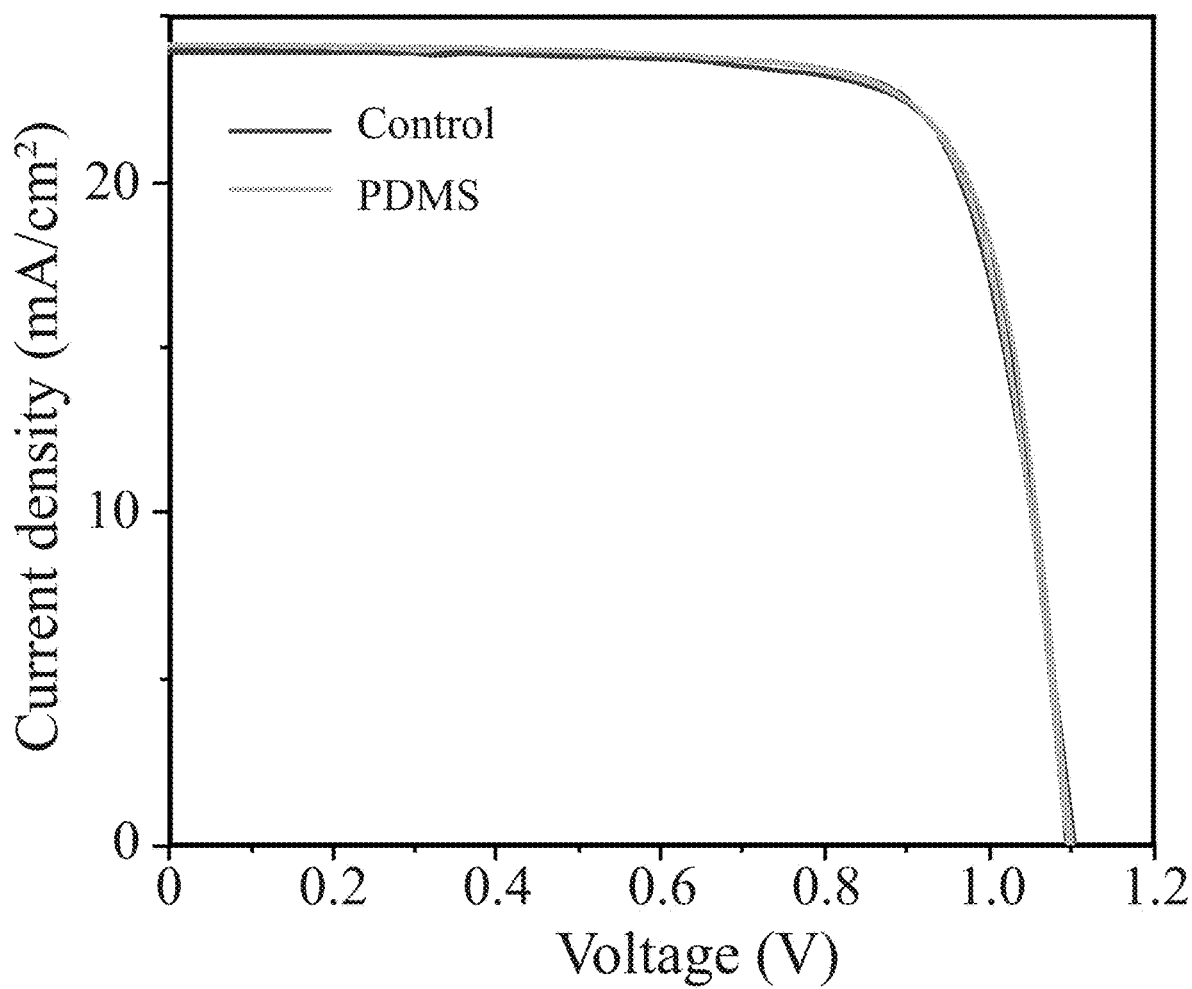
FIG. 7 illustrates, typical IV curves of PSCs with and without PDMS treatments, with a summary of the corresponding PV parameters shown in Table 1 below, according to some embodiments of the present disclosure.
Figure 8:
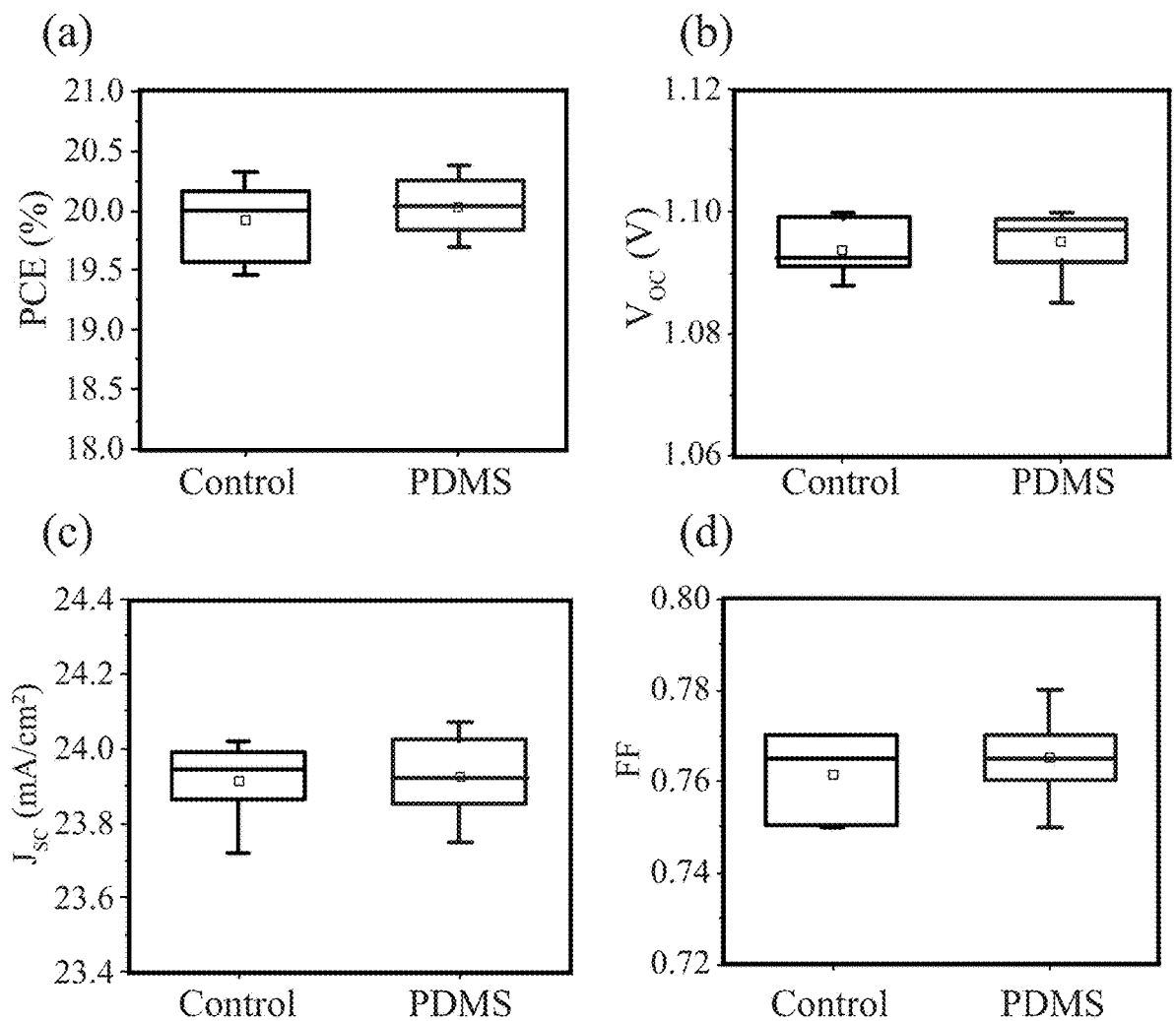
FIG. 8 illustrates a statistical comparison of PV parameters for PSCs with and without PDMS treatments, according to some embodiments of the present disclosure.
Figure 9:
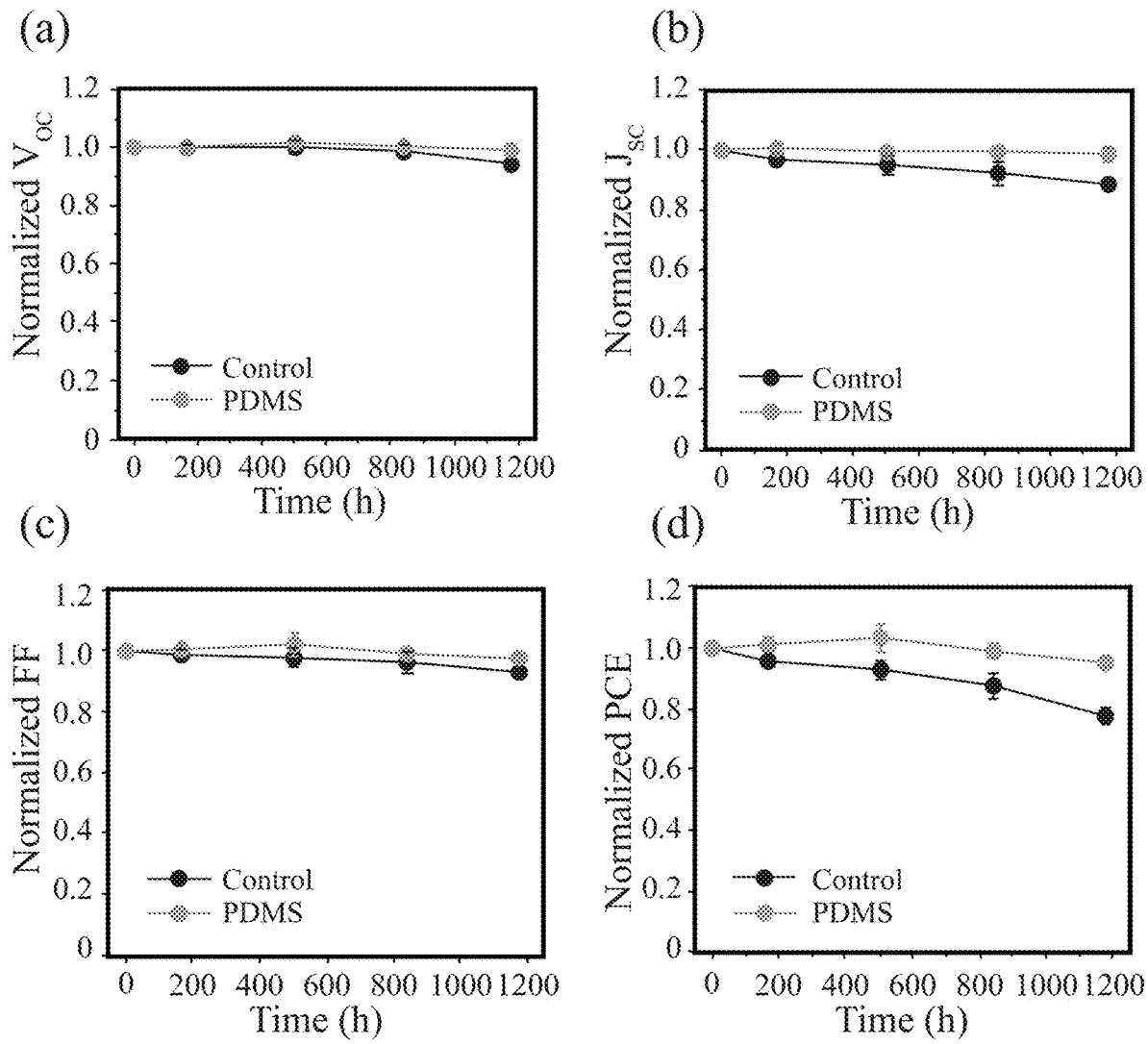
FIG. 9 illustrates a thermal stability comparison of PSCs with and without PDMS treatments, according to some embodiments of the present disclosure. These devices were aged on a hotplate at 55° C., in the dark, in ambient air with about 10%-20% relative humidity.
Figure 10:
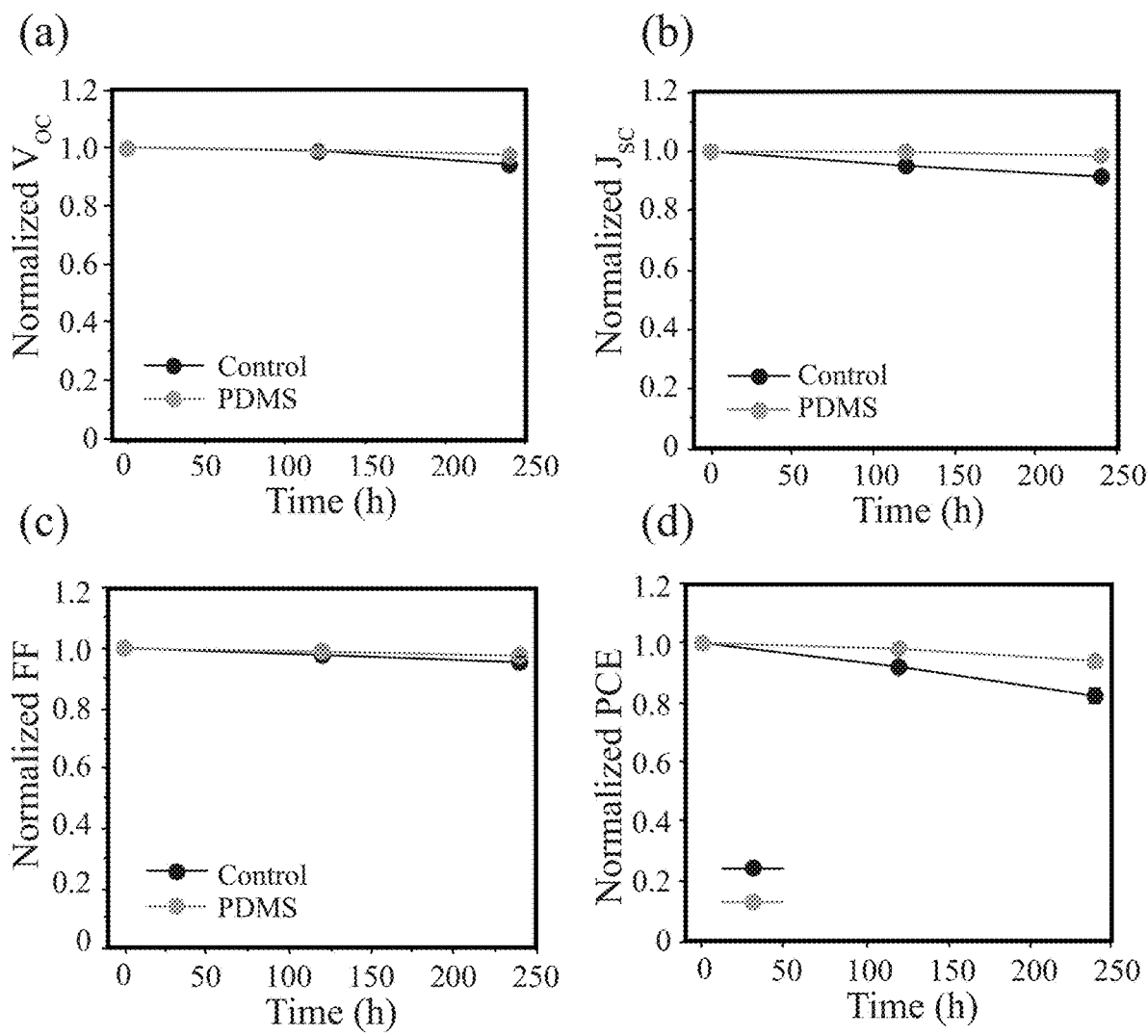
FIG. 10 illustrates a moisture stability comparison of PSCs with and without PDMS treatments, according to some embodiments of the present disclosure. These devices were aged at room temperature, in the dark, in humid air with about 55%-70% relative humidity.

The device efficiency and stability of pristine PSCs and those treated with uncured PDMS and resulting in a cured PDMS encapsulation layer and underlying layers containing cured PDMS by the described PDMS method were compared. The PDMS treatment showed negligible impact on device efficiency, but it significantly improved the thermal stability of devices at 55° C. in air. FIG. 7 illustrate typical IV curves of PSCs with and without PDMS treatments, according to some embodiments of the present disclosure. The key PSC metrics resulting from FIG. 7 are summarized below in Table 1. FIG. 8 illustrates a statistical comparison of PV parameters for PSCs with and without PDMS treatments, according to some embodiments of the present disclosure. FIG. 9 illustrates a thermal stability comparison of PSCs with and without PDMS treatments, according to some embodiments of the present disclosure. These devices were aged on a hotplate at 55° C., in the dark, in ambient air with about 10%-20% relative humidity. FIG. 10 illustrates a moisture stability comparison of PSCs with and without PDMS treatments, according to some embodiments of the present disclosure. These devices were aged at room temperature, in the dark, in humid air with about 55%-70% relative humidity.

TABLE 1

| PSC Metrics | | | | | |
|---|---|---|---|---|---|
| Sample | Direction | $J_{SC}$ (mA/cm$^2$) | $V_{OC}$ (V) | FF | PCE (%) |
| Control | Forward | 23.89 | 1.10 | 0.77 | 20.2 |
| Control | Reverse | 23.96 | 1.10 | 0.77 | 20.3 |
| PDMS | Forward | 24.05 | 1.11 | 0.76 | 20.3 |
| PDMS | Reverse | 24.07 | 1.10 | 0.77 | 20.4 |

EXAMPLES (SEE PANEL A OF FIG. 1)

Example 1. A device comprising: a first layer comprising an active material and a stabilizing material, wherein: the stabilizing material is dispersed within at least a portion of the active material, and the stabilizing material provides to the device an improved performance metric compared to a device comprising the first layer consisting of only the active material.

Example 2. The device of Example 1, wherein the stabilizing material comprises at least one of an oligomer, an elastomer, a polymer, or a resin.

Example 3. The device of either Example 1 or Example 2, wherein the active material comprises at least one of a perovskite, an organic material, or an inorganic material.

Example 4. The device of any one of Examples 1-3, wherein an organic material comprises at least one of phthalocyanines, polyacenes, squareness, perylene dyes, fullerenes, P3HT, MDMO-PPV, C$_{60}$BM, PC$_{70}$BM, PBDB-TF, BTP-4Cl, [Ru(4,4',4''-(COOH)$_3$-terpy)(NCS)$_3$], Di-tetrabutylammonium cis-bis(isothiocyanato)bis(2,2'-bipyridyl-4,4'-dicarboxylato)ruthenium(II), cis-Bis(isothiocyanato)bis(2,2'-bipyridyl-4,4'-dicarboxylato ruthenium(II), cis-Bis(isothiocyanato)(2,2'-bipyridyl-4,4'-dicarboxylato)(4,4'-dinonyl-2'-bipyridyl)ruthenium(II), cis-Bis(isothiocyanato)(2,2'-bipyridyl-4,4'-dicarboxylato)(4,4'-bis(5-hexylthiophen-2-yl)-2,2 bipyridyeruthenium(II), Ru(4,4-dicarboxylic acid-2,2'-bipyridine)(4,4'-bis(p-hexyloxystyryl)-2,2-bipyridine) (NCS)$_2$, cis-Bis(isothiocyanato)(2,2'-bipyridyl-4,4'-dicarboxylato)(4,4'-bis(5-(hexylthio)thiophen-2-yl)-2,2'-bipyridyl)ruthenium(II), 3-(2-Benzothiazolyl)-7-(diethylamino)coumarin, 3-(2-N-Methylbenzimidazolyl)-7-N,N-diethylaminocoumarin, 2,3,6,7-Tetrahydro-9-trifluoromethyl-1H,5H-quinolizino(9,1-gh)coumarin, 2-Cyano-3-[4-[4-(2,2-diphenylethenyl)phenyl]-1,2,3,3a,4,8b-hexahydrocyclopent[b]indol-7-yl]-2-propenoic acid, 5-[[4-[4-(2,2-Diphenylethenyl)phenyl]-1,2,3-3a,4,8b-hexahydrocyclopent[b]indol-7-yl]methylene]-2-(3-ethyl-4-oxo-2-thioxo-5-thiazolidinylidene)-4-oxo-3-thiazolidineacetic acid, 5-[[4-[4-(2,2-Diphenylethenyl)phenyl]-1,2,3,3a,4,8b-hexahydrocyclopent[b]indol-7-yl]methylene]-2-(3-octyl-4-oxo-2-thioxo-5-thiazolidinylidene)-4-oxo-3-thiazolidineacetic acid, 5-[3-(Carboxymethyl)-5-[[4-[4-(2,2-diphenylethenyl)phenyl]-1,2,3,3a,4,8b-hexahydrocyclopent[b]indol-7-yl]methylene]-4-oxo-2-thiazolidinylidene]-4-oxo-2-thioxo thiazolidinedodecanoic acid, or 1-ethyl-3 methylimidazolium tetrocyanoborate.

Example 5. The device of any one of Examples 1-4, wherein the inorganic material comprises at least one of silicon, cadmium, tellurium, gallium, arsenic, copper, indium, or selenium.

Example 6. The device of any one of Examples 1-5, wherein the polymer comprises at least one of silicon, carbon, oxygen, or hydrogen.

Example 7. The device of any one of Examples 1-6, wherein the polymer comprises a siloxane.

Example 8. The device of any one of Examples 1-7, wherein the siloxane comprises at least one of an alkyl group, a hydrogen atom, a halogen atom, or an aromatic group.

Example 9. The device of any one of Examples 1-8, wherein the alkyl group comprises at least one of a methyl group, an ethyl group, a propyl group, or a butyl group.

Example 10. The device of any one of Examples 1-9, wherein the aromatic group comprises at least one of an aryl group, a phenyl group, or a benzyl group.

Example 11. The device of any one of Examples 1-10, wherein the siloxane comprises a polydimethylsiloxane (PDMS) (i.e., silicone).

Example 12. The device of any one of Examples 1-11, wherein the polymer comprises at least one of a siloxy group, an acrylate, an epoxy group, or a carbonate group.

Example 13. The device of any one of Examples 1-12 wherein the polymer comprises at least one of polyethylene, polyvinylidene difluoride (PVDF), or a polyepoxide.

Example 14. The device of any one of Examples 1-13, wherein the polymer is present in the active material at a concentration between about 0.0001 wt % and about 1.0 wt %.

EXAMPLES (SEE PANEL B OF FIG. 1)

Example 15. The device of any one of Examples 1-14, further comprising a second layer comprising the polymer, wherein the second layer is positioned adjacent to the first layer.

Example 16. The device of any one of Examples 1-15, wherein the second layer has a thickness between about 10 nm and about 1 cm, or between about 0.5 mm and about 1 mm.

EXAMPLES (SEE PANEL C OF FIG. 1)

Example 17. The device of any one of Examples 1-16, further comprising: a third layer, wherein: the third layer is positioned between the first layer and the second layer, and at least a portion of the third layer comprises the polymer.

Example 18. The device of any one of Examples 1-17, wherein the polymer is present in the third layer at a concentration between about 0.0001 wt % and about 1.0 wt %.

Example 19. The device of any one of Examples 1-18, wherein the third layer comprises a first charge transport layer.

Example 20. The device of any one of Examples 1-19, wherein the third layer comprises an electron transport material (ETM) or a hole transport material (HTM).

Example 21. The device of any one of Examples 1-20, wherein the ETM comprises at least one of $TiO_2$, $SnO_2$, ZnO, $Nb_2O_5$, $BaSnO_3$, C60, PCBM, or ICBA.

Example 22. The device of any one of Examples 1-21, wherein the HTM comprises at least one of Spiro-OMeTAD, PTAA, P3HT, PEDOT:PSS, $NiO_x$, CuSCN, $CuGaO_2$, CuPc, spiro-TTB, MeO-2PACz, or 2PACz.

EXAMPLES (SEE PANEL D OF FIG. 1)

Example 23. The device of any one of Examples 1-22, further comprising: a fourth layer, wherein: the first layer is positioned between the third layer and the fourth layer, and at least a portion of the fourth layer comprises the polymer.

Example 24. The device of any one of Examples 1-23, wherein the polymer is present in the third layer at a concentration between about 0.0001 wt % and about 1.0 wt %.

Example 25. The device of any one of Examples 1-24, wherein the fourth layer comprises a second charge transport layer.

Example 26. The device of any one of Examples 1-25, wherein the fourth layer comprises an ETM or an HTM.

Example 27. The device of any one of Examples 1-26, wherein the ETM comprises at least one of $TiO_2$, $SnO_2$, ZnO, $Nb_2O_5$, $BaSnO_3$, C60, PCBM, or ICBA.

Example 28. The device of any one of Examples 1-27, wherein the HTM comprises at least one of Spiro-OMeTAD, PTAA, P3HT, PEDOT:PSS, $NiO_x$, CuSCN, $CuGaO_2$, CuPc, spiro-TTB, MeO-2PACz, or 2PACz.

Example 29. The device of any one of Examples 1-28, wherein the polymer is derived from a liquid precursor having a viscosity between 0.5 cP and 10000 cP, a surface tension between 15 mN/m and 40 mN/m, an average molecular weight between 154 g/mol and 100,000 g/mol.

METHOD EXAMPLES

Example 1. A method comprising: applying a liquid precursor of a stabilizing material to a surface of a device comprising a solid layer; treating the liquid precursor and the device, resulting in the liquid precursor penetrating at least a portion of the solid layer; and curing the liquid precursor, which converts it to the stabilizing material in a solid form mixed within at least a portion of the solid layer.

Example 2. The method of Example 1, wherein the liquid precursor has a viscosity between about 0.5 cP and about 10000 cP.

Example 3. The method of either Example 1 or Example 2, wherein the liquid precursor has a surface tension between about 15 mN/m and about 40 mN/m.

Example 4. The method of any one of Examples 1-3, wherein the liquid precursor has an average molecular weight between about 154 g/mol and about 100,000 g/mol.

Example 5. The method of any one of Examples 1-4, wherein the stabilizing material comprises at least one of an oligomer, an elastomer, a polymer, or a resin.

Example 6. The method of any one of Examples 1-5, wherein the solid layer comprises at least one of an active material, an electron transport material, or a hole transport material.

Example 7. The method of any one of Examples 1-6, wherein the applying is performed at a temperature between about 20° C. and about 50° C.

Example 8. The method of any one of Examples 1-7, wherein the treating is performed using a centrifuge.

Example 9. The method of any one of Examples 1-8, wherein the treating is performed for a period of time between about 30 seconds and about 5 days.

Example 10. The method of any one of Examples 1-9, wherein period of time is between about 30 seconds and about 1 hour.

Example 11. The method of any one of Examples 1-10, wherein the curing is performed at a temperature between about 20° C. and about 50° C.

Example 12. The method of any one of Examples 1-11, wherein the curing is performed at about ambient temperature.

The foregoing discussion and examples have been presented for purposes of illustration and description. The foregoing is not intended to limit the aspects, embodiments, or configurations to the form or forms disclosed herein. In the foregoing Detailed Description for example, various features of the aspects, embodiments, or configurations are grouped together in one or more embodiments, configurations, or aspects for the purpose of streamlining the disclosure. The features of the aspects, embodiments, or configurations, may be combined in alternate aspects, embodiments, or configurations other than those discussed above. This method of disclosure is not to be interpreted as reflecting an intention that the aspects, embodiments, or configurations require more features than are expressly recited in each claim. Rather, as the following claims reflect, inventive aspects lie in less than all features of a single foregoing disclosed embodiment, configuration, or aspect. While certain aspects of conventional technology have been discussed to facilitate disclosure of some embodiments of the present invention, the Applicants in no way disclaim these technical aspects, and it is contemplated that the claimed invention may encompass one or more of the conventional technical aspects discussed herein. Thus, the following claims are hereby incorporated into this Detailed Description, with each claim standing on its own as a separate aspect, embodiment, or configuration.

What is claimed is:

1. A device comprising:
    a first layer comprising a perovskite and a stabilizing material; and
    a second layer comprising a charge transport material and the stabilizing material, wherein:
    the second layer is in physical contact with the first layer,
    the stabilizing material comprises at least one of an oligomer, an elastomer, a polymer, or a resin, and
    the stabilizing material is present in the first layer at a concentration between 0.0001 wt % and 1.0 wt %.

2. The device of claim 1, wherein the polymer comprises at least one of silicon, carbon, oxygen, or hydrogen.

3. The device of claim 2, wherein the polymer comprises at least one of a siloxane, a polyethylene, a polyvinylidene difluoride, or a polyepoxide.

4. The device of claim 3, wherein the siloxane further comprises at least one of an alkyl group, a hydrogen atom, a halogen atom, an aromatic group, a siloxy group, an acrylate, an epoxy group, or a carbonate group.

5. The device of claim 4, wherein the alkyl group comprises at least one of a methyl group, an ethyl group, a propyl group, or a butyl group.

6. The device of claim 4, wherein the aromatic group comprises at least one of an aryl group, a phenyl group, or a benzyl group.

7. The device of claim 3, wherein the siloxane comprises a polydimethylsiloxane.

8. The device of claim 1, further comprising:
    a third layer, wherein:
    the first layer is positioned between the third layer and the second layer, and
    at least a portion of the third layer comprises the stabilizing material.

9. The device of claim 8, further comprising:
    a fourth layer, wherein:
    the second layer is positioned between the first layer and the fourth layer, and
    at least a portion of the fourth layer comprises the stabilizing material.

10. The device of claim 7, wherein the siloxane further comprises poly(methylhydro-siloxane).

11. The device of claim 1, wherein the second layer comprises a hole transport material.

12. The device of claim 8, wherein the third layer comprises an electron transport material.

13. The device of claim 9, wherein the fourth layer consists essentially of the stabilizing material.

14. The device of claim 1, further comprising:
    a starting power conversion efficiency (PCE) and a final PCE, wherein:
    the starting PCE is measured before the device is exposed to a test,
    the final PCE is measured after the device is exposed to the test,
    the test comprises maintaining the device at a temperature of 55° C., in the absence of light, at a relative humidity between 10% and 20%, for at least 1200 hours, and
    the final PCE is at least 80% of the starting PCE.

* * * * *